US009806739B1

(12) United States Patent
Kojima et al.

(10) Patent No.: US 9,806,739 B1
(45) Date of Patent: Oct. 31, 2017

(54) OPTICAL SIGNAL TRANSMITTER AND OPTICAL COMMUNICATION SYSTEM USING CONSTANT MODULUS FORMATS, AND METHOD FOR GENERATING MODULATION CODES

(71) Applicants: Mitsubishi Electric Research Laboratories, Inc., Cambridge, MA (US); Mitsubishi Electric Corporation, Chiyoda-Ku, Tokyo (JP)

(72) Inventors: Keisuke Kojima, Weston, MA (US); Tsuyoshi Yoshida, Tokyo (JP); Toshiaki Koike-Akino, Malden, MA (US); David Millar, Concord, MA (US); Kieran Parsons, Cambridge, MA (US)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/372,611

(22) Filed: Dec. 8, 2016

Related U.S. Application Data

(60) Provisional application No. 62/370,884, filed on Aug. 4, 2016.

(51) Int. Cl.
| | |
|---|---|
| *H03M 1/00* | (2006.01) |
| *H03M 7/30* | (2006.01) |
| *H04B 10/516* | (2013.01) |
| *H04B 10/508* | (2013.01) |

(52) U.S. Cl.
CPC ............ *H03M 7/30* (2013.01); *H04B 10/508* (2013.01); *H04B 10/516* (2013.01); *H04B 10/5161* (2013.01)

(58) Field of Classification Search
CPC ... H03M 7/30; H04B 10/508; H04B 10/5161; H04B 10/516
USPC .............................................. 341/137, 14, 51
See application file for complete search history.

(56) References Cited

U.S. PATENT DOCUMENTS

| | | | |
|---|---|---|---|
| 6,588,948 B2 * | 7/2003 | Tatoh ....................... | G02B 1/02 385/92 |
| 8,452,192 B2 * | 5/2013 | Yan ......................... | H04B 10/60 375/325 |
| 9,584,259 B2 * | 2/2017 | Millar ................... | H04L 1/0041 |
| 9,621,275 B2 * | 4/2017 | Kojima ................ | H04B 10/508 |

FOREIGN PATENT DOCUMENTS

WO        2009124861        10/2009

\* cited by examiner

*Primary Examiner* — Brian Young
(74) *Attorney, Agent, or Firm* — Gene Vinokur; James McAleenan; Hironori Tsukamoto

(57) ABSTRACT

An optical data coding method includes at least steps of selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles, arranging a first part of the symbol on a first circular grid of the first amplitude ring on the X-polarization constellation format, and arranging a second part of the symbol on a second circular grid of the second amplitude ring on the Y-polarization constellation format.

18 Claims, 15 Drawing Sheets

| X-pol. $(b_0 b_1 b_2, b_6)$ | $b_0$ $b_1$ $b_2$ | Gray mapped phase |
|---|---|---|
| | $b_6$ | Amplitude |
| Y-pol. $(b_3 b_4 b_5, b_7)$ | $b_3$ $b_4$ $b_5$ | Gray mapped phase |
| | $b_7$ | Amplitude |

$b_5 = \text{XOR}(b_0, b_1, b_2)$, $b_7 = \text{NOT}(b_6)$
$b_6 = \text{XOR}(b_2, b_3, b_4)$

FIG. 3A

| X-pol. $(b_0 b_1 b_2, b_6)$ | $b_0$ $b_1$ $b_2$ | Gray mapped phase |
|---|---|---|
| | $b_6$ | Amplitude |
| Y-pol. $(b_3 b_4 b_5, b_7)$ | $b_3$ $b_4$ $b_5$ | Gray mapped phase |
| | $b_7$ | Amplitude |

$b_6 = \text{XOR}(b_0, b_1, b_2, b_3, b_4, b_5)$, $b_7 = \text{NOT}(b_6)$

FIG. 3B

| X-pol. ($b_0b_1b_2,b_3$) | | Y-pol. ($b_4b_5b_6,b_7$) | |
|---|---|---|---|
| $b_0$ $b_1$ $b_2$ | $b_3$ | $b_4$ $b_5$ $b_6$ | $b_7$ |
| Gray mapped phase | Amplitude | Gray mapped phase | Amplitude |

$b_7 = \text{NOT}(b_3)$

FIG. 3C

OPTICAL SIGNAL TRANSMITTER AND OPTICAL COMMUNICATION SYSTEM USING CONSTANT MODULUS FORMATS, AND METHOD FOR GENERATING MODULATION CODES

FIELD OF THE INVENTION

This invention relates to an optical signal transmitter and optical communication system, and method for generating modulation codes, and more specifically, an optical signal transmitter and optical communication system for coherent optical communication using constant modulus formats, and method for generating multiple modulation codes based on constant modulus formats.

BACKGROUND OF THE INVENTION

In optical communications, as a data rate of the optical communication increases, complicated modulation formats such as quadrature-amplitude modulation (QAM) formats including 8QAM, 16QAM, 64QAM, 256QAM, 1024QAM, etc., are used because sufficient Euclidian distances are designed. However, these modulation formats typically cause signal power variations depending on the symbols, and can cause phase noise on the signal of the channel as well as other wavelength-division multiplexed channels through the optical fiber nonlinearity. Phase-shift keying (PSK) modulation formats offer constant modulus which provide a constant signal power at each symbol timing. However, the PSK modulation formats show a poor performance regarding the higher bit-error rate (BER) compared to the QAM formats, because the PSK modulation formats are based on shorter Euclidian distances than those of the QAM formats.

If certain properties of the QAM formats and the PSK modulation formats are properly combined and applied without losing their advantages, it would result in the lower BER, higher data rates, longer fiber distance and the higher spectral density. Accordingly, other coded modulation schemes, which provide sufficient Euclidian distances with less signal power variations per symbols, are required.

SUMMARY OF THE INVENTION

Some embodiments are based on the recognition that an optical data coding method for generating optical data codes from a symbol using a processor in communication with a memory improves the low BER, data rates, fiber distance and the spectral density. The optical data coding method comprises steps of selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles; arranging a first part of the symbol on a first circular grid on the first amplitude ring on the X-polarization constellation format; arranging a second part of the symbol on a second circular grid on the second amplitude ring on the Y-polarization constellation format; encoding the first part of the symbol into a first subset of an optical data code using the first amplitude ring indicating a first amplitude value and the first circular grid indicating a first phase angle; and encoding the second part of the symbol into a second subset of the optical data code using the second amplitude ring indicating a second amplitude value and the second circular grid indicating a second phase angle.

Another embodiment discloses a non-transient computer-readable recording medium. The recording medium stores therein a program to be executed by a processor for encoding a symbol to optical signal data. The program causing the processor to execute steps of selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles; arranging a first part of a symbol on a first circular grid of the first amplitude ring on the X-polarization constellation format; arranging a second part of the symbol on a second circular grid of the second amplitude ring on the Y-polarization constellation format; encoding the first part of the symbol into a first subset of an optical data code using the first amplitude ring indicating a first amplitude value and the first circular grid indicating a first phase angle; and encoding the second part of the symbol into a second subset of the optical data code using the second amplitude ring indicating a second amplitude value and the second circular grid indicating a second phase angle.

Another embodiment discloses an optical transmitter that includes an encoder device configured to generate and transmit first and second modulation signals, wherein the encoder device generates the first and second modulation signals based optical data codes generated by using an optical data coding method; a continuous wave (CW) optical source configured to transmit a CW optical signal; a polarization beam splitter configured to split the CW optical signal of the CW optical source into first and second parts of the CW optical signal; a first modulator connected to the encoder device, wherein the first modulator receives and modulates the first part of the CW optical signal to generate a first modulated optical carrier signal according to the first modulation signal; a second modulator connected to the encoder device, wherein the second modulator receives and modulates the second part of the CW optical signal to generate a second modulated optical carrier signal according to the second modulation signal; and a beam combiner configured to combine the first and second modulated optical carrier signals to generate and transmit a modulated optical carrier signal, wherein the optical data coding method comprises steps of selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles; arranging a first part of the symbol on a first circular grid on the first amplitude ring on the X-polarization constellation format; arranging a second part of the symbol on a second circular grid on the second amplitude ring on the Y-polarization constellation format; encoding the first part of the symbol into a first subset of an optical data code using the first amplitude ring indicating a first amplitude value and the first circular grid indicating a first phase angle; and encoding the second part of the symbol into a second subset of the optical data code using the second amplitude ring indicating a second amplitude value and the second circular grid indicating a second phase angle.

BRIEF DESCRIPTION OF THE DRAWINGS

FIG. 3A shows a summary of a mapping rule of the 5-bits/symbol modulation format;

FIG. 3B shows a summary of a mapping rule of the 6-bits/symbol modulation format;

FIG. 3C shows a summary of a mapping rule of the 7-bits/symbol modulation format;

DETAILED DESCRIPTION OF THE PREFERRED EMBODIMENTS

Figure 1:
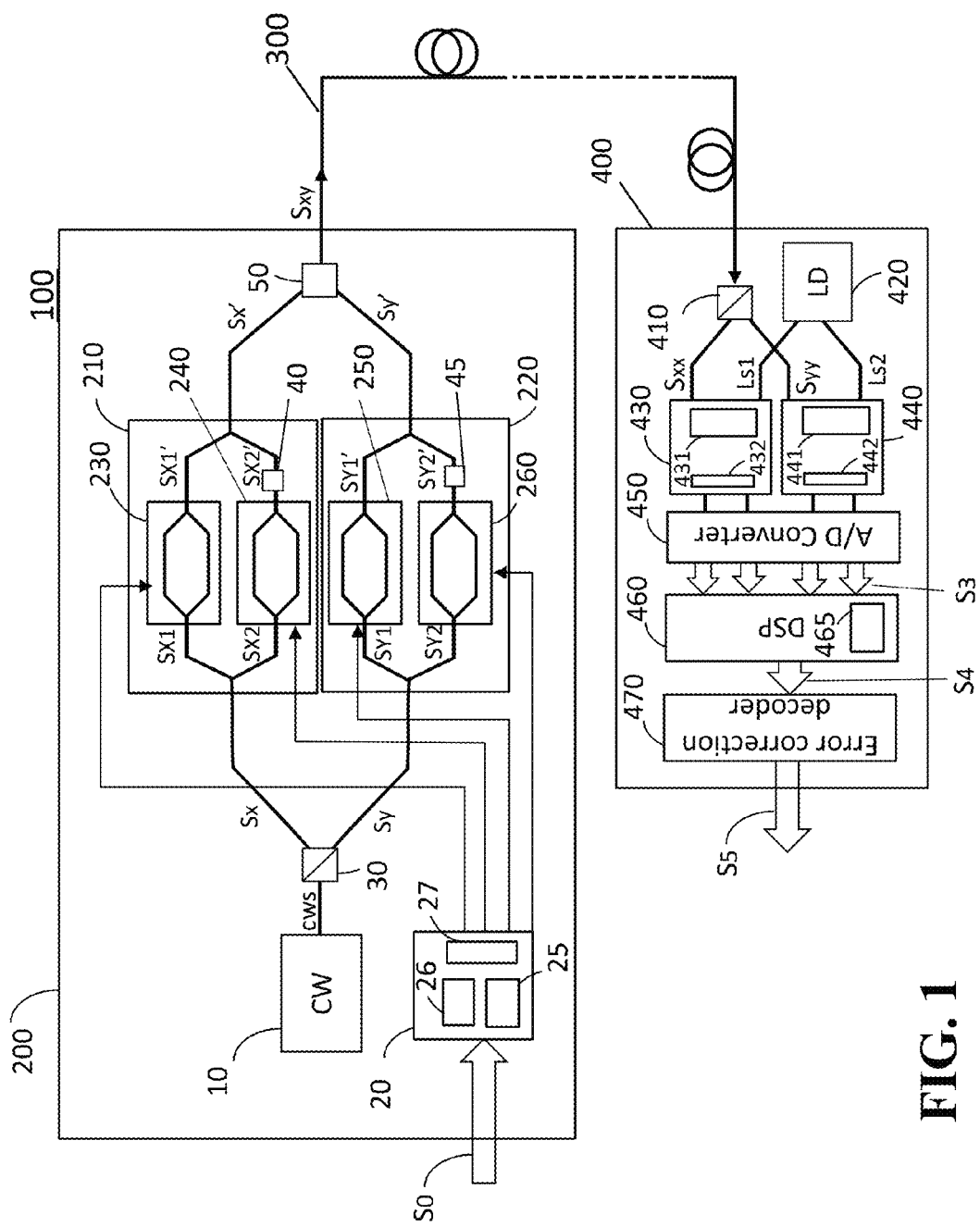
FIG. 1 shows an optical communication system including an optical signal transmitter and an optical signal receiver.

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

FIG. 1 shows an optical communication system including an optical signal transmitter and an optical signal receiver;

Some embodiments are based on realization that a four-dimensional 2-ary amplitude 8-ary phase-shift keying (4D-2A8PSK) code is advantageous for generating a constant modulus 4D code for coherent optical communications.

Coherent Optical Communication System

FIG. 1 shows an optical communication system 100 including an optical signal transmitter 200 and an optical signal receiver 400 according to some embodiments of the invention. An optical fiber 300 connected to the optical signal transmitter 200 and the optical signal receiver 400 is also indicated in the figure.

The optical signal transmitter 200 includes a continuous wave optical carrier source 10 (CW 10) such as a laser diode, an encoder device 20, a polarization beam splitter 30, an x-polarization modulator 210, a y-polarization modulator 220 and a polarization beam combiner 50.

The x-polarization modulator 210 includes a first modulator 230, a second modulator 240, waveguides Sx, Sx1, Sx1', Sx2, Sx2' and Sx' and a π/2 phase-shifter 40 arranged in the waveguide Sx2'.

The y-polarization modulator 220 includes a third modulator 250, a fourth modulator 260, and waveguides Sy, Sy1, Sy1', Sy2, Sy2' Sy' and a π/2 filter 45 arranged in the waveguide Sy2'.

The first, second, third and fourth modulators 230, 240, 250 and 260 may be constructed from Mach-Zenhder interferometers, variable optical attenuators, phase modulators, etc.

The encoder device 20 includes an error correction circuit 25, an encoding circuit 26 and a driver circuit 27, a memory (not shown) connected to a processor (not shown) and an input/output (I/O) part (not shown) connectable with a data storage device or data communication cable outside of the encoder device 20. When an encoding format of the encoder device 20 needs to be changed to a new encoding format, a new program may be introduced to the encoder device 20 via the I/O part so that the encoding format of the encoder device 20 for the optical signal modulation is renewed and the optical transmitter 200 transmits an optical carrier signal modulated according to the new encoding format. The I/O part and memory may be disposed in the optical transmitter 200 separately from the encoder device 20.

When receiving a data set via a data bus S0, the encoder device 20 performs data processing for generating an encoded data set with predetermined error correction according to a predetermined modulation format scheme using the error correction circuit 25 and the encoding circuit 26. Successively, the driver circuit 27 transmits modulation driver signals of the encoded data set to the first modulator 230, the second modulator 240, the fourth modulator 250 and the fifth modulator 260, respectively. In this case, the predetermined modulation format scheme may be a 5 bits/symbol modulation format, a 6 bits/symbol modulation format, a 7 bits/symbol modulation format, or a time hybrid 4-dimensional modulation format based on 4D-2A8PSK Modulation Format Scheme according to some embodiments of the invention.

Descriptions regarding the five bit-symbol modulation format, the six bit-symbol modulation format, the seven bit-symbol modulation format, and the time hybrid 4-dimensional modulation format based on the 4D-2A8PSK Modulation Format Scheme will be provided in the following sections.

The CW 10 generates and transmits an optical carrier to the polarization beam splitter 30 via a waveguide CWS connecting the CW and the polarization beam splitter 30. The polarization beam splitter 30 sprits the optical carrier into an X-polarization carrier and a Y-polarization carrier.

The X-polarization carrier is guided through the waveguide Sx and separated into a first X-polarization carrier and a second X-polarization carrier via the waveguides Sx1 and Sx2. The first X-polarization carrier is introduced to the first modulator 230 and the second X-polarization carrier is introduced to the second modulator 240 via the waveguides Sx1 and Sx2. The first X-polarization carrier is modulated by the first modulator 230 and the second X-polarization carrier is modulated by the second modulator 240 according to the modulation driver signals supplied from the driver circuit 27 of the encoder device 20, resulting a modulated first X-polarization carrier and a modulated second X-polarization carrier.

In this case, an amplitude of the modulated first X-polarization carrier and an amplitude of the modulated second X-polarization carrier are arranged to be different according to the modulation driver signals from the encoder device 20. For instance, when the amplitude of the modulated first X-polarization carrier is smaller than a predetermined amplitude, then the amplitude of the modulated second X-polarization carrier is greater than the predetermined amplitude. This process makes it possible to generate an approximately constant power for a sum of the modulated first X-polarization carrier and the modulated second X-polarization carrier.

After passing through the π/2 filter 40, the modulated second X-polarization carrier merges with the modulated first X-polarization carrier, resulting a merged modulated X-polarization carrier.

The Y-polarization carrier is guided through the waveguide Sy and separated into a first Y-polarization carrier and a second Y-polarization carrier via the waveguides Sy1 and Sy2. The first Y-polarization carrier is introduced to the third modulator 250 and the second Y-polarization carrier is introduced to the fourth modulator 260 via the waveguides Sy1 and Sy2, respectively. The first Y-polarization carrier is modulated by the third modulator 250 and the second Y-polarization carrier is modulated by the fourth modulator 260 according to the modulation driver signals supplied from the driver circuit 27 of the encoder device 20, resulting a modulated first Y-polarization carrier and a modulated second Y-polarization carrier.

In this case, an amplitude of the modulated first Y-polarization carrier and an amplitude of the modulated second Y-polarization carrier are arranged to be different according to the modulation driver signals from the encoder device 20. For instance, when the amplitude of the modulated first Y-polarization carrier is smaller than the predetermined amplitude, then the amplitude of the modulated second Y-polarization carrier is greater than the predetermined amplitude.

This process makes it possible to generate an approximately constant power for a sum of the modulated first Y-polarization carrier and the modulated second Y-polarization carrier.

After passing through the π/2 filter 45, the modulated second Y-polarization carrier merges with the modulated first Y-polarization carrier, resulting a merged modulated Y-polarization carrier.

The merged modulated X-polarization carrier and the merged modulated Y-polarization carrier are combined at the polarization beam combiner 50, resulting an optical carrier signal. The optical carrier signal propagates via the optical fiber 300.

Accordingly, as the sum of the modulated first X-polarization carrier and the modulated second X-polarization carrier is an approximately constant power and the sum of the modulated first Y-polarization carrier and the modulated second Y-polarization carrier is an approximately constant power, the optical carrier signal transmitted from the optical signal transmitter 200 becomes an approximately constant power. This can be substantial advantages for coherent optical communication systems, because potential nonlinear effect while propagating in the optical fiber is avoidable.

The optical signal receiver 400 includes a polarization beam splitter 410, a local oscillator laser 420 (LD 420), an X-polarization receiver 430, a Y-polarization receiver 440, an analog/digital (A/D) converter 450, a digital signal processor 460 and an error correction-decoder 470.

When receiving the optical carrier signal via the optical fiber 300, the optical signal receiver 400 performs a signal processing for the optical carrier signal using the X- and Y-polarization receivers 430 and 440, the A/D converter 450, the DSP 460 and the decoder 470, and generates and transmits a decoded data set out via a data bus S5.

The optical carrier signal is split into an X-polarization reception carrier and a Y-polarization reception carrier by the polarization beam splitter 410, and respectively introduced to the X-polarization receiver 430 and the Y-polarization receiver 440 via waveguides Sxx and Syy. The LD transmits reference optical signals to the X-polarization receiver 430 and the Y-polarization receiver 440 via waveguides Ls1 and Ls2.

The X-polarization receiver 430 includes a first optical hybrid circuit 431 and a set of photodiodes 432. The X-polarization receiver 430 converts the X-polarization reception carrier into a first in-phase signal and a first quadra-phase signal and transmits the signals to the A/D converter 460 using the first optical hybrid circuit 431 and the set of photodiodes 432.

The Y-polarization receiver 440 includes a third optical hybrid circuit 441 and a set of photodiodes 442. The Y-polarization receiver 440 converts the Y-polarization reception carrier into a second in-phase signal and a second quadra-phase signal and transmits the signals to the A/D converter 460 using the second optical hybrid circuit 441 and the set of photodiodes 442.

Upon receiving the first and second in-phase signals and the first and second quadrature-phase signals from the Y- and X-polarization receivers 430 and 440, the A/D converter 450 converts the first and second in-phase signals and the first and second quadra-phase signals into first and second in-phase digital signals and first and second quadra-phase digital signals, and transmits respective digital signals to the DSP 460 via a bus S3.

The DSP 460 having an adaptive equalizer (not shown) performs a digital signal processing for decoding the respective digital signals according to the encoding format of the encoder device 20, and transmits decoded digital signals to the error correction-decoder 470. The adaptive equalizer of the DSP 450 may be applied to the signals transmitted from the optical signal transmitter 200.

Upon receiving the decoded digital signals, the error correction-decoder 470 encodes the decoded digital signals based on the predetermined error correction used in the error correction circuit 25 of the encoder device 20 in the optical transmitter 200 and generates error-corrected digital data being output via the bus S5.

The DSP 460 may include an adaptive equalizer (not shown), a memory (not shown) connected to a processor (not shown) and an input/output (I/O) part 465 connectable with a data storage device or data communication cable outside of the DSP 460. When the encoding format of the encoder device 20 is changed to a new encoding format, a new decoding program may be introduced to the DSP 460 via the I/O part 465 so that the optical carrier signal modulated based on the new encoding format from the optical signal transmitter 200 is properly decoded to a decoded digital signal. The I/O part 465 and memory may be disposed in the optical signal receiver 400 separately from the DSP 460. Encoding formats used in the DPS 460 will be described below in detail.

4D-2A8PSK Modulation Format Scheme

Figures 2A, 2B:
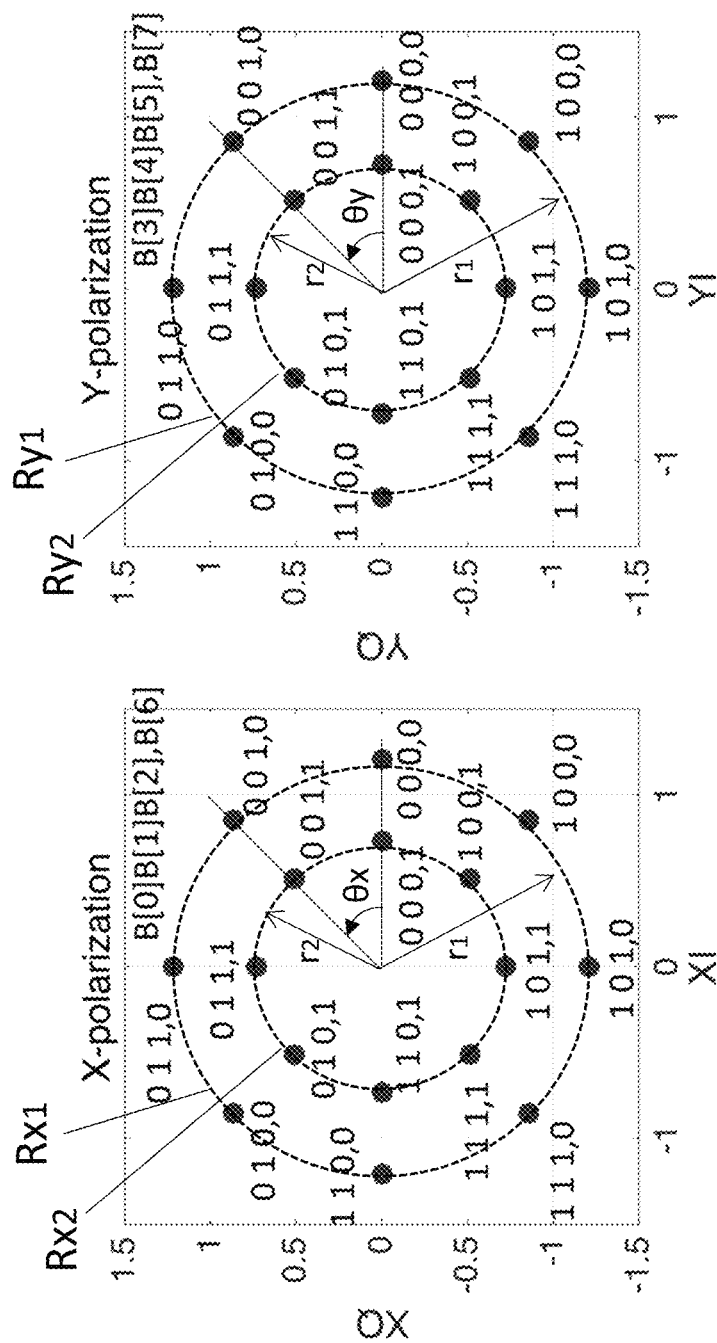
FIG. 2A and FIG. 2B show constellations of a 4D-2A8PSK modulation format.

FIG. 2A and FIG. 2B show constellations of a 4D-2A8PSK modulation format. The constellations include an X-polarization constellation and a Y-polarization constellation.

FIG. 2A is the X-polarization constellation that includes an XI axis indicating the in-phase component of X-polarization and an XQ axis indicating the quadrature component of the X-polarization. The X-polarization constellation includes first and second amplitude rings Rx1 and Rx2 with first and second amplitude radii $r_1$ and $r_2$ indicating amplitude values. The first and second amplitude rings Rx1 and Rx2 form circular grids determined by phase angles θx as indicated in FIG. 2A. Each of the circular grids on the first and second amplitude rings Rx1 and Rx2 is assigned three bits as a form of {B[0] B[1] B[2]} and one parity bit B[6]. The three bits {B[0] B[1] B[2]} range from {0 0 0} to {1 1 1} and the parity bit B[6] varies between "0" and "1."

FIG. 2B is the Y-polarization constellation that includes an YI axis indicating the in-phase component of Y-polarization and an YQ axis indicating the quadrature component of the Y-polarization. The Y-polarization constellation includes first and second amplitude rings Ry1 and Ry2 with the first and second amplitude radii $r_1$ and $r_2$ indicating amplitude values. The first and second amplitude rings Ry1 and Ry2 form circular grids determined by phase angles θy as indicated in FIG. 2B. Each of the circular grids on the first and second amplitude rings Ry1 and Ry2 is assigned three bits as a form of {B[3] B[4] B[5]} and one parity bit B[7]. The three bit {B[3] B[4] B[5]} ranges from {0 0 0} to {1 1 1} and the parity bit B[6] varies between "0" and "1."

In some embodiments, the circular grids on the amplitude rings Rx1, Rx2, Ry1 and Ry2 are determined by shifting the phase angles θx and θy by π/4 radian along the amplitude rings for 4D-2A8PSK.

In some embodiments, the amplitude rings Rx1, Rx2, Ry1 and Ry2 may be approximately circular with predetermined amount of radius variations with respect to $r_1$ and $r_2$, and the angles θx and θy may be varied within a predetermined amount of angle variations. Further, an amplitude ratio of the first and second amplitude radii, $r_2/r_1$, may be changed in a range between 0.5 and 0.8 according to the system design of the optical communication system.

It should be noted that there are 256 combinations achievable by combining the X-polarization constellation and the Y-polarization constellation according to the 4D-2A8PSK. In the 4D-2A8PSK modulation format, when the first amplitude ring Rx1 with radius $r_1$ is selected for one polarization, the second amplitude ring Ry2 with radius $r_2$ is selected for the other polarization to achieve four-dimensional constant modulus property. Accordingly, 4D-2A8PSK Modulation Format Scheme according to embodiments of the present invention may be applied to any optical data coding schemes that manage symbols composed of 8 bits or less than 8 bits.

As this format scheme provides sufficient Euclidian distances, 4D constant modulus (constant power) characteristics, and Gray labeling for 8 bits/symbol codeword bits, it possible to provide advantageous characteristics in nonlinear transmission.

Five Bit-Symbol Modulation Format

A five bits/symbol (5-bits/symbol: a symbol expressed by 5 bits) modulation format is described by use of FIG. 2A and FIG. 2B. The 5-bits/symbol modulation format is performed based on the 4D-2A8PSK modulation format scheme with the Gray-mapped 8-ary phase-shift keying (8PSK) having two amplitude rings arranged on each of the X-polarization constellation and Y-polarization constellation. The amplitude rings Rx1 and Rx2 of the X-polarization constellation have circular grids identified by three bits indicating phase angles and radii indicating amplitude values identified by a parity bit as shown in FIG. 2A. Further, the amplitude rings Ry1 and Ry2 of the Y-polarization constellation have circular grids identified by three bits indicating the phase angles and the radii indicating the amplitude values identified by a parity bit as shown in FIG. 2B.

FIG. 3A also shows a summary of a mapping rule of the 5-bits/symbol modulation format. It should be noted that the bit array {B[0] B[1] B[2] B[3] B[4] B[5] B[6] B[7]} are expressed by {$b_0$ $b_1$ $b_2$ $b_3$ $b_4$ $b_5$ $b_6$ $b_7$} in the figure. As indicated, {$b_0$ $b_1$ $b_2$} and {$b_3$ $b_4$ $b_5$} are Gray mapped phases, and the bit $b_5$ is the additional bit and bits $b_6$ and $b_7$ are parity bits indicating amplitude values. More specific descriptions will be given in the following.

The 5-bit codeword expressed by five information bits of {B[0] B[1] B[2] B[3] B[4]} encoded into an optical data code by mapping a first subset {B[0] B[1] B[2]} on the X-polarization constellation and a second subset {B[3] B[4]} on the Y-polarization constellation based on a five-bit-modulation format according to an embodiment of the invention.

A procedure of mapping the first and second subsets of the 5-bit symbol onto the X-polarization constellation and the Y-polarization constellation is performed by use of eight bits, {B[0] B[1] B[2] B[3] B[4] B[5] B[6] B[7]}.

The eight bits are composed of the five information bits of {B[0] B[1] B[2] B[3] B[4]} and parity bits of {B[5] B[6] B[7]}. The parity bit B[5] is determined by a logical exclusive OR (XOR) operation of the codeword bits {B[0] B[1] B[2]}, which is expressed by $$B[5]=\text{XOR}(B[0],B[1],B[2]). \tag{1}$$

Further, the parity bit B[6] is determined by the following logical operation.

$$B[6]=\text{XOR}(B[2],B[3],B[4]) \tag{2}$$

The parity bits {B[6], B[7]} are configured to be complementary with each other, thus their relation is expressed by $$B[7]=\text{NOT}(B[6]). \tag{3}$$

It is noted that although the additional bit B[5] is created from the first subset of the 5-bit symbol by XOR operation in this example, other combination of bits from the 5-bit symbol may be used according to the design of a modulation format scheme. Further, another logical operation may be performed according to the design of a modulation format scheme.

It is also noted that when obtaining the parity bits B[5] and B[6], the bit B[2] is commonly utilized for the logical XOR operations in equations (2) and (3). In other embodiments, another codeword bit in the 5-bit symbol, such as B[0], B[1], B[3] or B[4] may be selected for the logical operations.

For instance, when the parity bit B[6] is determined to be "0" after the XOR operation of equation (2), the parity bit B[7] becomes "1" according to equation (3), then the first subset {B[0] B[1] B[2]} is arranged onto a grid on the first amplitude ring Rx1 of the X-polarization constellation. In this case, the circular grid on the first amplitude ring Rx1 is selected so that the three bits of the circular grid on the first amplitude ring Rx1 correspond to {B[0] B[1] B[2]} of the first subset of the 5-bit symbol. Successively, the second subset {B[3] B[4] B[5]} is arranged onto a grid on the second amplitude ring Ry2 of the Y-polarization constellation according to the parity bit B[7] indicating "1." In this case, the circular grid on the second amplitude ring Ry2 is selected so that the three bits of the circular grid on the second amplitude ring Ry2 correspond to {B[3] B[4] B[5]} of the second subset. Accordingly, for the 5-bit symbol given, the circular grid on the first amplitude ring Rx1 designates an amplitude value of $r_1$ and a phase angle determined by the three bits {B[0] B[1] B[2]} arranged on the first amplitude ring Rx1, and the circular grid on the second amplitude ring Ry2 designates an amplitude value of $r_2$ and a phase angle determined by the three bits {B[3] B[4] B[5]} arranged on the second amplitude ring Ry2.

In another example, when the parity bit B[6] is determined to be "1" after the XOR operation of equation (2), the parity bit B[7] becomes "0" according to equation (3), then the first subset of {B[0] B[1] B[2]} is arranged onto a grid on the second amplitude ring Rx2 of the X-polarization constellation. In this case, the circular grid on the second amplitude ring Rx2 is selected so that the three bits of the circular grid on the second amplitude ring Rx2 correspond to {B[0] B[1] B[2]} of the first subset of the 5-bit symbol. Successively, the second subset {B[3] B[4] B[5]} is arranged onto a grid on the first amplitude ring Ry1 of the Y-polarization constellation according to the parity bit B[7] indicating "0." In this case, the circular grid on the first amplitude ring Ry1 is selected so that the three bits of the circular grid on the first amplitude ring Ry1 correspond to {B[3] B[4] B[5]} of the second subset.

Figures 4A, 4B:
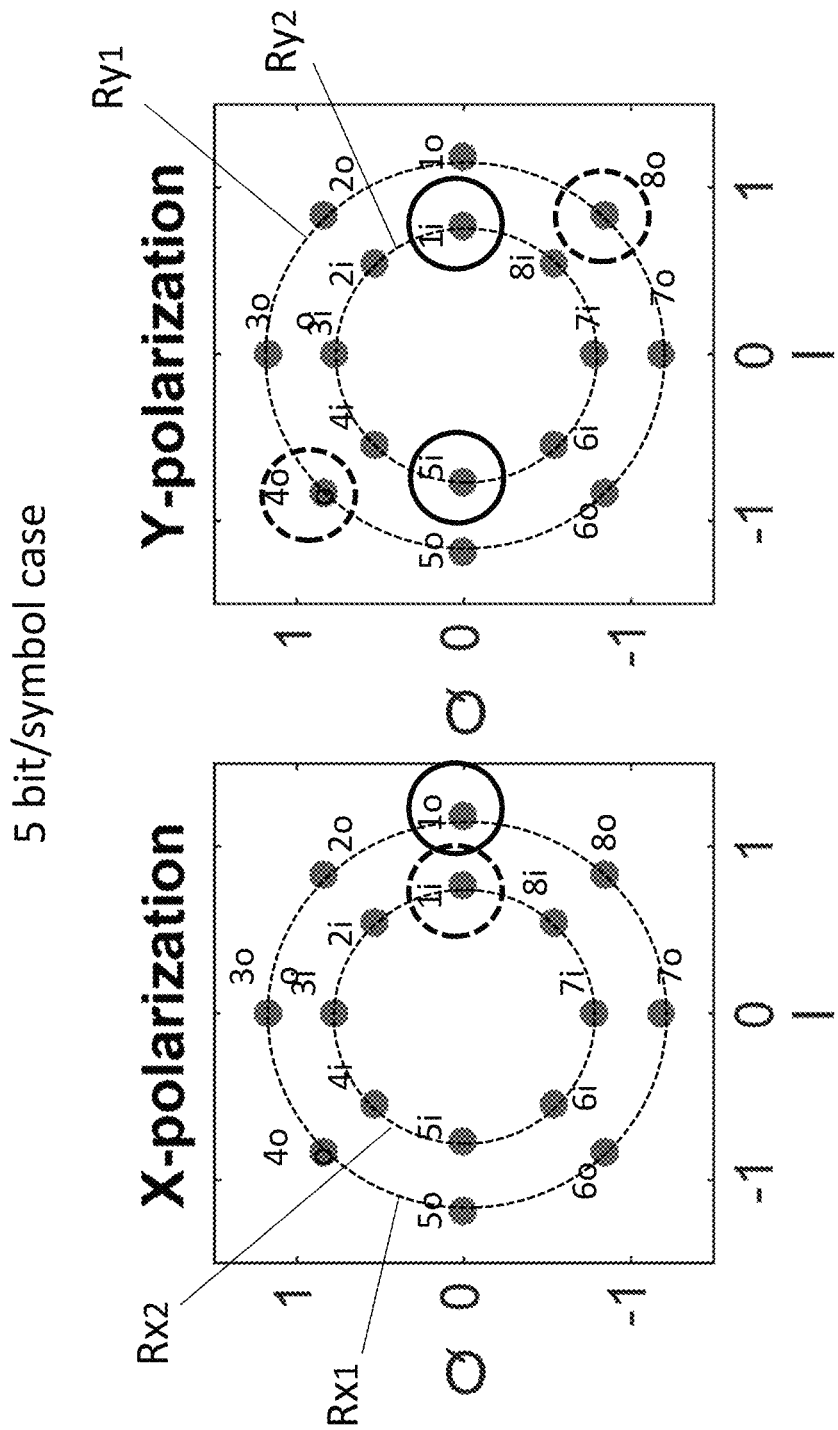
FIG. 4A and FIG. 4B show an example of the 5 bits/symbol modulation format.

FIG. 4A and FIG. 4B show an example of the 5 bits/symbol modulation format according to an embodiment of the invention. Addresses "1o" through "8o" and "1i" through "8o" are arranged to circular grids on the amplitude rings Rx1, Rx2, Ry1 and Ry2 instead of three bits {0 0 0} through {1 1 1}.

In this case, when a first subset of a symbol is assigned to a grid (1o) on the ring Rx1 in the X-polarization constellation, a second subset of the symbol have two possible circular grids (1i and 5i) to be assigned on the ring Ry2 in the Y-polarization constellation, and when a first subset of another symbol is assigned to a grid (1i) on the ring Rx2 in the X-polarization constellation, then a second subset of the symbol have two circular grids (4o and 8o) to be assigned on the ring Ry1 in the Y-polarization constellation.

Accordingly, for the 5-bit symbol given, the circular grid on the second amplitude ring Rx2 designates an amplitude value of $r_2$ and a phase angle determined by the three bits {B[0] B[1] B[2]} arranged on the second amplitude ring Rx2, and the circular grid on the first amplitude ring Ry1 designates an amplitude value of $r_1$ and a phase angle determined by the three bits {B[3] B[4] B[5]} arranged on the first amplitude ring Ry1.

Six Bit-Symbol Modulation Format

A six bits/symbol (6-bit symbol: a symbol expressed by 6 bits) modulation format is described by use of FIG. 2A and FIG. 2B in the following. Similarly to the case of the 5-bits/symbol modulation format, the 6 bits/symbol modulation format is performed based on the 4D-2A8PSK modulation format scheme with the Gray-mapped 8-ary phase-shift keying (8PSK) having two amplitude rings arranged on each of the X-polarization constellation and Y-polarization constellation. The amplitude rings Rx1 and Rx2 of the X-polarization constellation have circular grids identified by three bits indicating the phase angles and the radii indicating amplitude values identified by the parity bit as shown in FIG. 2A. Further, the amplitude rings Ry1 and Ry2 of the Y-polarization constellation have the circular grids identified by three bits indicating phase angles and the radii indicating amplitude values identified by the parity bit as shown in FIG. 2B.

FIG. 3B also shows a summary of a mapping rule of the 6-bits/symbol modulation format. It should be noted that the codeword bits {B[0] B[1] B[2] B[3] B[4] B[5] B[6] B[7]} are expressed by {$b_0$ $b_1$ $b_2$ $b_3$ $b_4 b_5 b_6 b_7$} in the figure. As indicated, {$b_0$ $b_1$ $b_2$} and {$b_3$ $b_4$ $b_5$} are Gray mapped phases, and bits $b_6$ and $b_7$ are parity bits indicating amplitude values. More specific descriptions will be given in the following.

The 6-bit symbol expressed by six information bits of {B[0] B[1] B[2] B[3] B[4] B[5]} is encoded into an optical data code by mapping a first subset {B[0] B[1] B[2]} on the X-polarization constellation and a second subset {B[3] B[4] B[5]} on the Y-polarization constellation based on a six-bit-modulation format according to an embodiment of the invention.

A procedure of mapping the first subset and second subset of the 6-bit symbol onto the X-polarization constellation and the Y-polarization constellation is performed by use of eight bits, {B[0] B[1] B[2] B[3] B[4] B[5] B[6] B[7]}. The eight bits are composed of {B[0] B[1] B[2] B[3] B[4] B[5]} and parity bits {B[6], B[7]}, in which each of the bits is a codeword bit. The codeword bit B[6] is determined by a logical exclusive OR (XOR) operation of the codeword bits {B[0] B[1] B[2] B[3] B[4] B[5]}, expressed as follows.

$$B[6]=\text{XOR}(B[0],B[1],B[2],B[3],B[4],B[5]B[6],B[7]) \quad (4)$$

The parity bits {B[6], B[7]} are configured to be complementary each other, then their relation is expressed by $$B[7]=\text{NOT}(B[6]). \quad (5)$$

For instance, when the codeword bit B[6] is determined to be "0" after the XOR operation of equation (4), the parity bit B[7] becomes "1" according to equation (5), and the first subset of {B[0] B[1] B[2]} is arranged onto a grid on the ring Rx1. In this case, the circular grid on the ring Rx1 is selected so that the three bits on the circular grid on the ring Rx1 correspond to {B[0] B[1] B[2]} of the first subset of the 6-bit symbol. Successively, the second subset of {B[3] B[4] B[5]} is arranged onto a grid on the ring Ry2 according to the parity bit B[7] indicating "1." In this case, the circular grid on the ring Ry2 is selected so that the three bits of the circular grid on the ring Ry2 correspond to {B[3] B[4] B[5]} of the second subset of the 6-bit symbol. Accordingly, each of circular grids on the amplitude rings Rx1, Rx2, Ry1 and Ry2 designates a phase angle and an amplitude value of each subset of the 6-bit symbol.

Figures 5A, 5B:
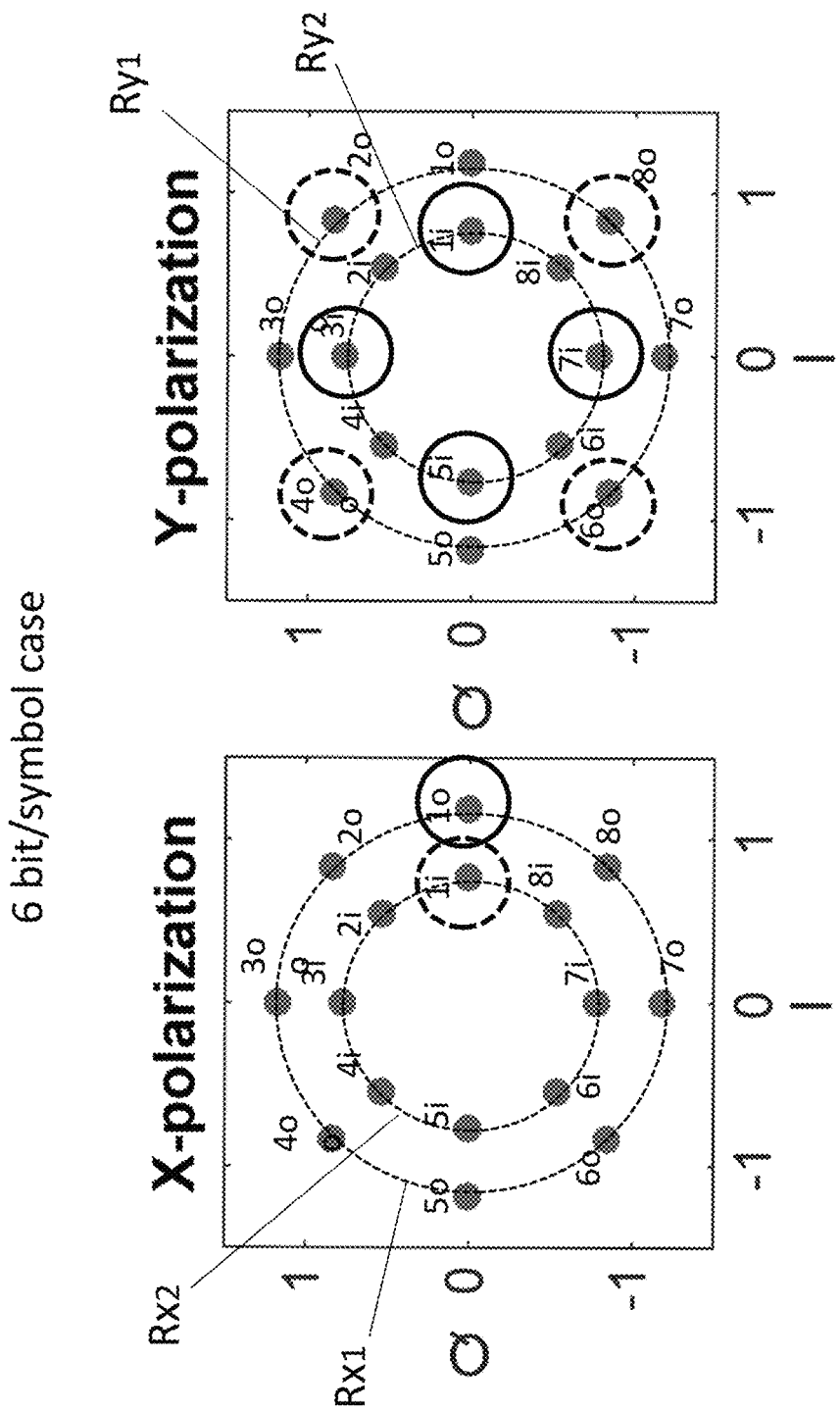
FIG. 5A and FIG. 5B show an example of the 6 bits/symbol modulation format.

FIG. 5A and FIG. 5B show an example of the 6 bits/symbol modulation format according to an embodiment of the invention. Grid addresses "1o" through "8o" and "1i" through "8o" are arranged to circular grids on the amplitude rings Rx1, Rx2, Ry1 and Ry2 instead of three bits {0 0 0} through {1 1 1}.

In this case, when a first subset of a symbol is assigned to a grid (1o) on the ring Rx1 in the X-polarization constellation, a second subset of the symbol have four possible circular grids (1i, 3i, 5i, and 7i) to be assigned on the ring Ry2 in the Y-polarization constellation, and when a first subset of another symbol is assigned to a grid (1i) on the ring Rx2 in the X-polarization constellation, then a second subset of the symbol have four circular grids (2o, 4o, 6o, and 8o) to be assigned on the ring Ry1 in the Y-polarization constellation.

Seven Bit-Symbol Modulation Format

FIG. 3C shows a summary of a mapping rule of the 7-bits/symbol modulation format. The seven bits/symbol (7-bit symbol: a symbol expressed by 7 bits) will described in detail in the following.

Similarly to the cases of the 5-bits/symbol and 6-bits/symbol modulation formats, the 7 bits/symbol modulation format is performed based on the 4D-2A8PSK modulation format scheme with the Gray-mapped 8-ary phase-shift keying (8PSK) having two amplitude rings arranged on each of the X-polarization constellation and Y-polarization constellation. The amplitude rings Rx1 and Rx2 of the X-polarization constellation have circular grids identified by three bits indicating the phase angles and the radii indicating amplitude values identified by the parity bit as shown in FIG. 2A. Further, the amplitude rings Ry1 and Ry2 of the Y-polarization constellation have the circular grids identified by three bits indicating phase angles and the radii indicating amplitude values identified by the parity bit as shown in FIG. 2B.

A 7-bit symbol is expressed by seven information bits of {B[0] B[1] B[2] B[3] B[4] B[5] B[6]}. The 7-bit symbol is partitioned into a first subset {B[0] B[1] B[2] B[3]} and a second subset {B[4] B[5] B[6]}. A parity bit B[7] is created by a logical operation expressed by $$B[7]=\text{NOT}(B[3]). \qquad (6)$$

In this case, the first subset {B[0] B[1] B[2] B[3]} is applied to the X-polarization constellation by using the bit B[3] as a parity bit of the first subset. The rest of bits {B[0] B[1] B[2]} are used to identify a grid on one of the amplitude rings Rx1 and Rx2 depending on the value of the parity bit B[3]. The second subset {B[4] B[5] B[6]} is applied to the Y-polarization constellation to identify a grid on one of the amplitude rings Ry1 and Ry2 depending on the value of the parity bit B[7].

For instance, when the codeword bit B[3] of the 7-bit symbol indicates "0," the parity bit B[7] becomes "1" and a grid on the ring Rx1 is selected so that the three bits of the circular grid on the ring Rx1 correspond to first three bits {B[0] B[1] B[2]} of the 7-bit symbol. As a result, the first subset {B[0] B[1] B[2] B[3]} of the 7-bit symbol is encoded to identify an amplitude value indicated by the radius $r_1$ of the ring Rx1 and a phase angle indicated by the circular grid. Further, the second subset {B[4] B[5] B[6]} is applied to select a grid on the ring Ry2 so that the three bits of the circular grid on the ring Ry2 correspond to second three bits {B[3] B[4] B[5]} of the second subset of the 7-bit symbol.

Further, when the codeword bit B[3] of the 7-bit symbol indicates "1," the parity bit B[7] becomes "0" and a grid on the ring Rx2 is selected so that the three bits of the circular grid on the ring Rx2 correspond to first three bits {B[0] B[1] B[2]} of the 7-bit symbol. As a result, the first subset {B[0] B[1] B[2] B[3]} of the 7-bit symbol is encoded to identify an amplitude value indicated by the radius $r_1$ of the ring Rx1 and a phase angle indicated by the circular grid. Further, the second subset {B[4] B[5] B[6]} is applied to select a grid on the ring Ry2 so that the three bits of the circular grid on the ring Ry2 correspond to the second three bits {B[3] B[4] B[5]} of the second subset of the 7-bit symbol.

Figures 6A, 6B:
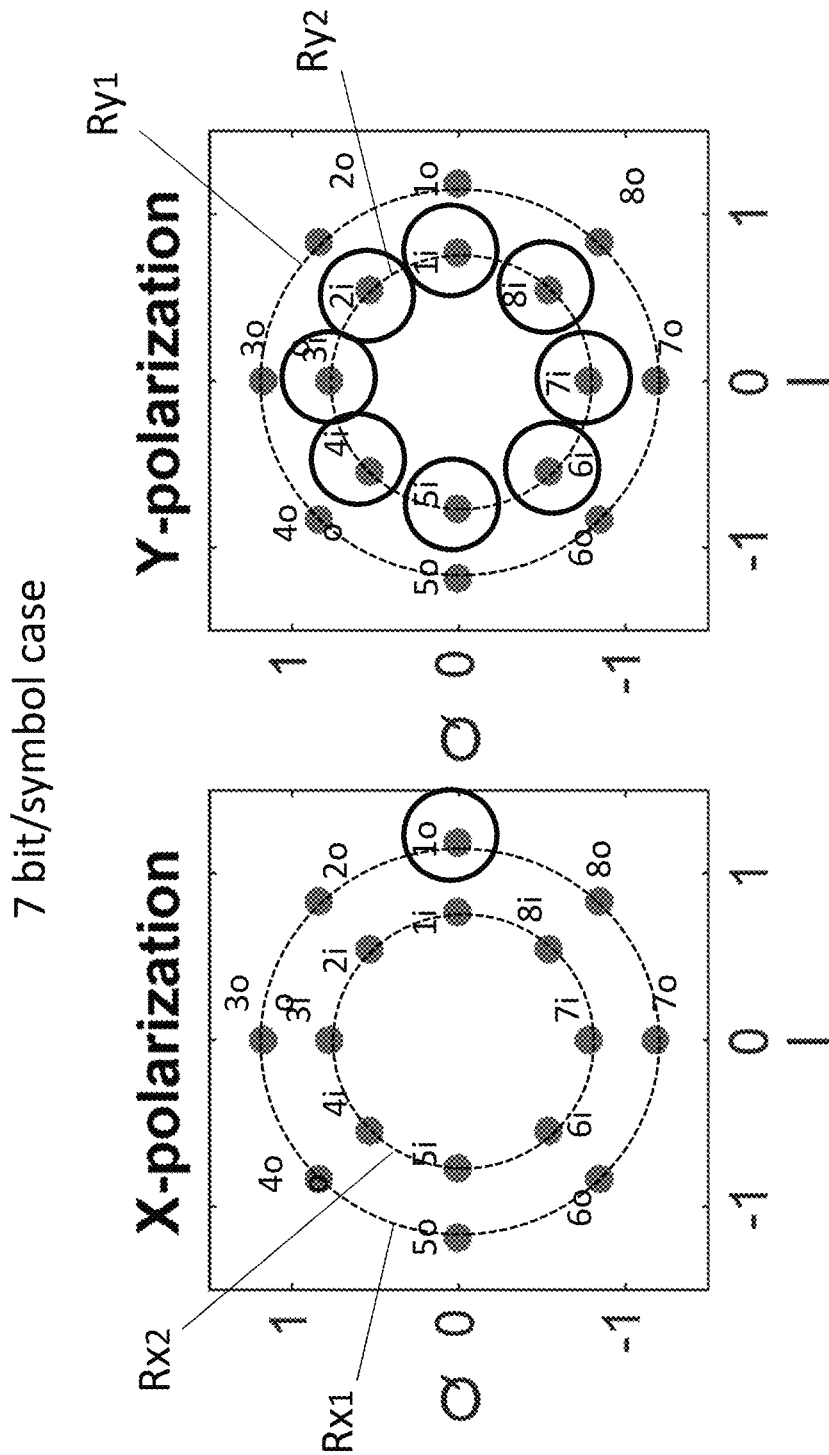
FIG. 6A and FIG. 6B show an example of the 7 bits/symbol modulation format.

FIG. 6A and FIG. 6B show an example of the 7 bits/symbol modulation format according to an embodiment of the invention. Grid addresses "1o" through "8o" and "1i" through "8o" are arranged at circular grids on the amplitude rings Rx1, Rx2, Ry1 and R2 instead of three bits {0 0 0} through {1 1 1}.

In this case, when a first subset of a symbol is assigned to a grid (1o) on the ring Rx1 in the X-polarization constellation, then a second subset can be assigned to all possible circular grids (1i-8i) on the ring Ry2 in the Y-polarization constellation.

Figure 7B:
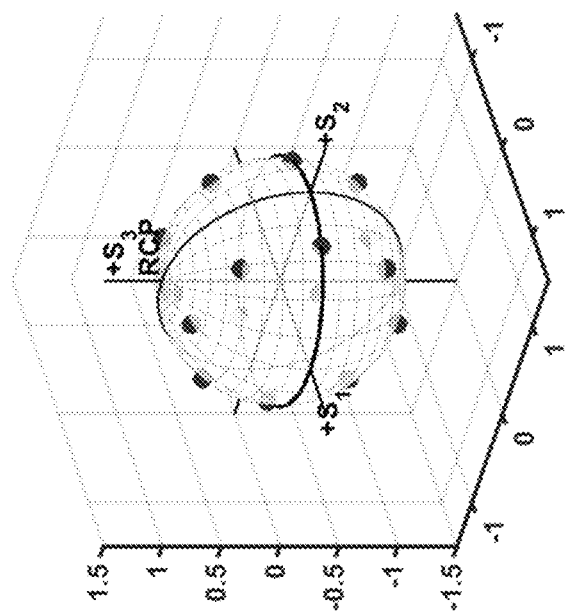
FIG. 7A and FIG. 7B show Stocks space representations of the 5B4D-2A8PSK and the 7B4D-2A8PSK.
Figure 7A:
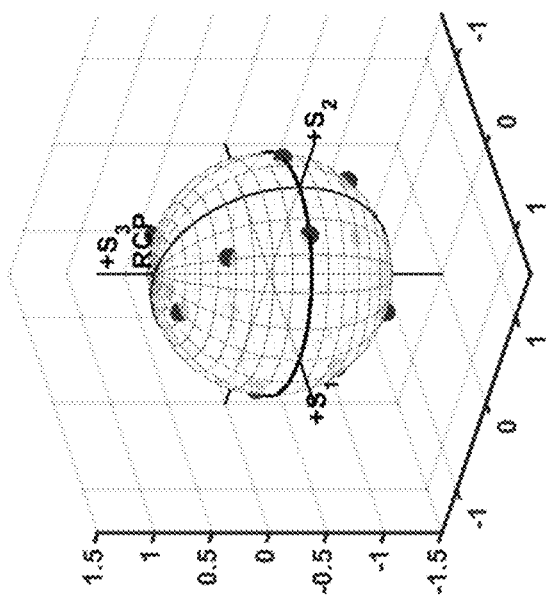

FIG. 7A and FIG. 7B show Stocks space representations of the 5B4D-2A8PSK and the 7B4D-2A8PSK. In both formats, signal codes are arranged on the surface f the Stokes sphere, which indicate that the total power over used on the communication over the 5B4D-2A8PSK and the 7B4D-2A8PSK are constant.

Adaptive Equalizer for 2A8PSK Format

The adaptive equalizer of the DSP 460 in the receiver 400 may be used when receiving the transmitted symbols. In the coherent optical communications, a constant modulus algorithm (CMA) or radius directed equalizer (RDE) is typically used.

The CMA uses assumption that the original signal has a constant amplitude used in both the X- and Y-polarization constellations. This assumption cannot be directly applied to 4D-2A8PSK, since each of the X- and Y-polarizations includes two values of amplitudes. Therefore, the CMA needs to be modified such that the algorithm relies on the condition that the combined power of x- and y-polarizations is constant.

The RDE uses the assumption that there are multiple values of amplitude exist in both X- and Y-polarizations. This can be technically applied to 4D-2A8PSK. However, as in the conventional RDE, if the decision on the amplitude is done independently, it may make more wrong decisions. Instead, if we take advantage of the fact that one polarization takes the inner ring, other polarization takes the outer ring, it will make much less wrong decisions. In other words, the polarization whose signal power is larger takes the outer ring, while the polarization whose signal power is smaller takes the inner ring. Alternatively, we can use soft information, in that the probability of choosing larger ring in the polarization becomes larger depending on the relative power level in that polarization compared to the other polarization.

Time Slots of Modulation Formats

Figure 8:
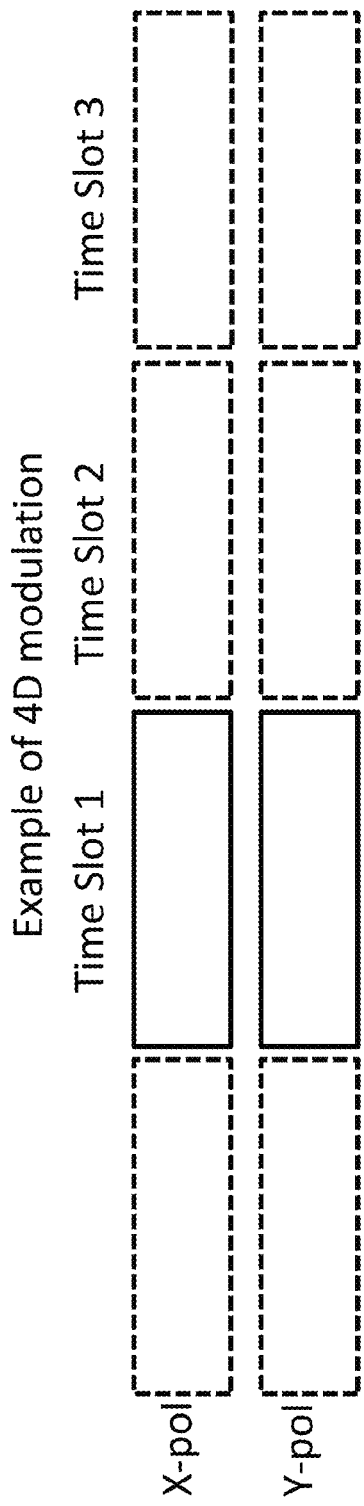
FIG. 8 shows an example of four-dimensional modulation.

FIG. 8 shows an example of four-dimensional modulation. In this case, a word occupies each time slot, and power of the sum of X- and Y-polarization constellations of each word is designed to be constant.

Figure 9:
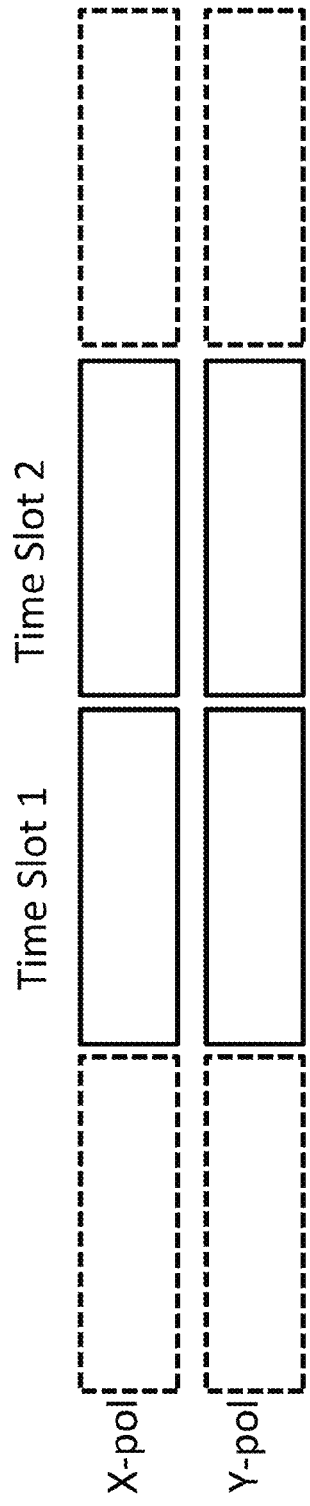
FIG. 9 shows an example of eight-dimensional modulation.

FIG. 9 shows an example of eight-dimensional modulation (8D modulation). In this case, a word occupies two time slots, and power of the sum of X- and Y-polarization constellations at each time slot is designed to be constant.

Figure 10:
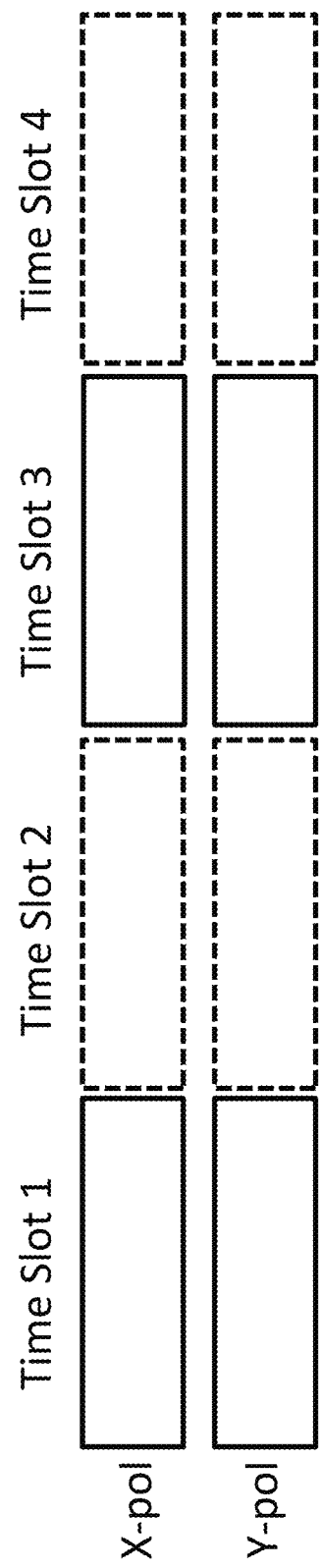
FIG. 10 shows an example of time hybrid four-dimensional modulation.

FIG. 10 shows an example of time-domain hybrid four-dimensional modulation (Hybrid 4D modulation). In this case, a word occupies alternating time slots using different modulation formats, and power of the sum of X- and Y-polarization constellations at least in one time slot is designed to be constant.

Rate-Adaptive Modulation Schemes

In some embodiments, the 4D-2A8PSK Modulation Format Scheme according to the invention may be applied to Time-domain hybrid modulation.

As the 4D-2A8PSK Modulation Format Scheme according to the invention can be applied to the conventional basic constellation of 2A8PSK, it is possible to cover 5.25, 5.5, 6.25, or 6.5 bits/symbol, for example, by use of time-domain hybrid scheme.

7-Bit 8 Dimension Grassmann 2AQPSK-2A8PSK Format

Grassmann code is known to be effective to reduce the so-called cross polarization modulation (XPolM) effects. (Koike et al., US 20120263454 A1). Grassmann code can be realized by the combination of 2AQPSK and 2A8PSK. 2AQPSK is considered to be a special case of 2A8PSK, in which only 4 phases are used out of the 8 possible phases of 2A8PSK.

For instance, a 3.5 bits/symbol format may be achieved as follows.

Figure 11A:
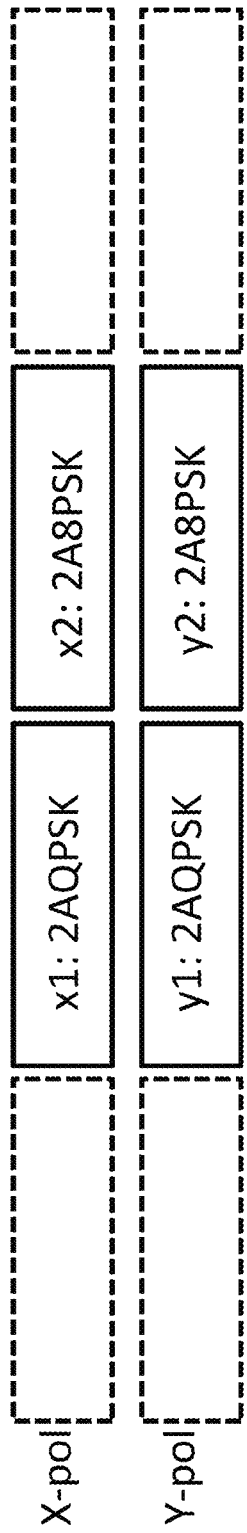
FIG. 11A shows is an example of a 7-bit 8 dimension Grassmann 2AQPSK format.

FIG. 11A is an example of a 7-bit 8 dimension Grassmann 2AQPSK-2A8PSK format used for the 3.5 bits/symbol format. Two time slots, a time slot 1 and a time slot 2, are used for a 7-bit symbol in the format. As the 7 bit symbol is divided by two slots, this format is called the 3.5 bits/symbol format. The time slot 1 arranges x1 in the X-polarization constellation and y1 in the Y-polarization constellation, and the time slot 2 arranges x2 in the X-polarization constellation and y2 in the Y-polarization constellation. In this case, x1 and y1 are arranged to the 2AQPSK format, x2 and y2 are arranged to the 2A8PSK format as indicated in the figure.

When x1, x2 and y1 are arranged to be independent variable, the Grassmann code requires x1, x2, y1 and y2 to satisfy the following relation.

$$y2 = -x1^* \cdot y1/x2^* \quad (7)$$

where * denotes complex conjugate.

Further, the 2AQPSK format and 2A8PSK are designed to use the identical circular rings $r_1$ and $r_2$ (see FIGS. 2A and 2B), when x1 takes the circular ring $r_1$, y1 takes the circular ring $r_2$, or vice versa. Similarly, when x2 takes the circular ring $r_1$, y2 takes the circular ring $r_2$, or vice versa.

In order to satisfy an average power per a polarization constellation being 1, there is a relation between the circular rings $r_1$ and $r_2$, since the amplitude rings indicate amplitude values.

$$r_1^2 + r_2^2 = 2 \quad (8)$$

The ratio of the amplitude rings $r_1/r_2$ may be between 0.5 and 0.8.

When B[0]~B[6] are used as information bits (modulation bits), the rest of bits B[7]~B[8] may be used as parity bits as follows.

$$B[7] = XOR(B[4], B[5], B[6]) \quad (9)$$

$$B[8] = XOR(B[0], B[1], B[2], B[3], B[4], B[5], B[6]) \quad (10)$$

Figure 12A:
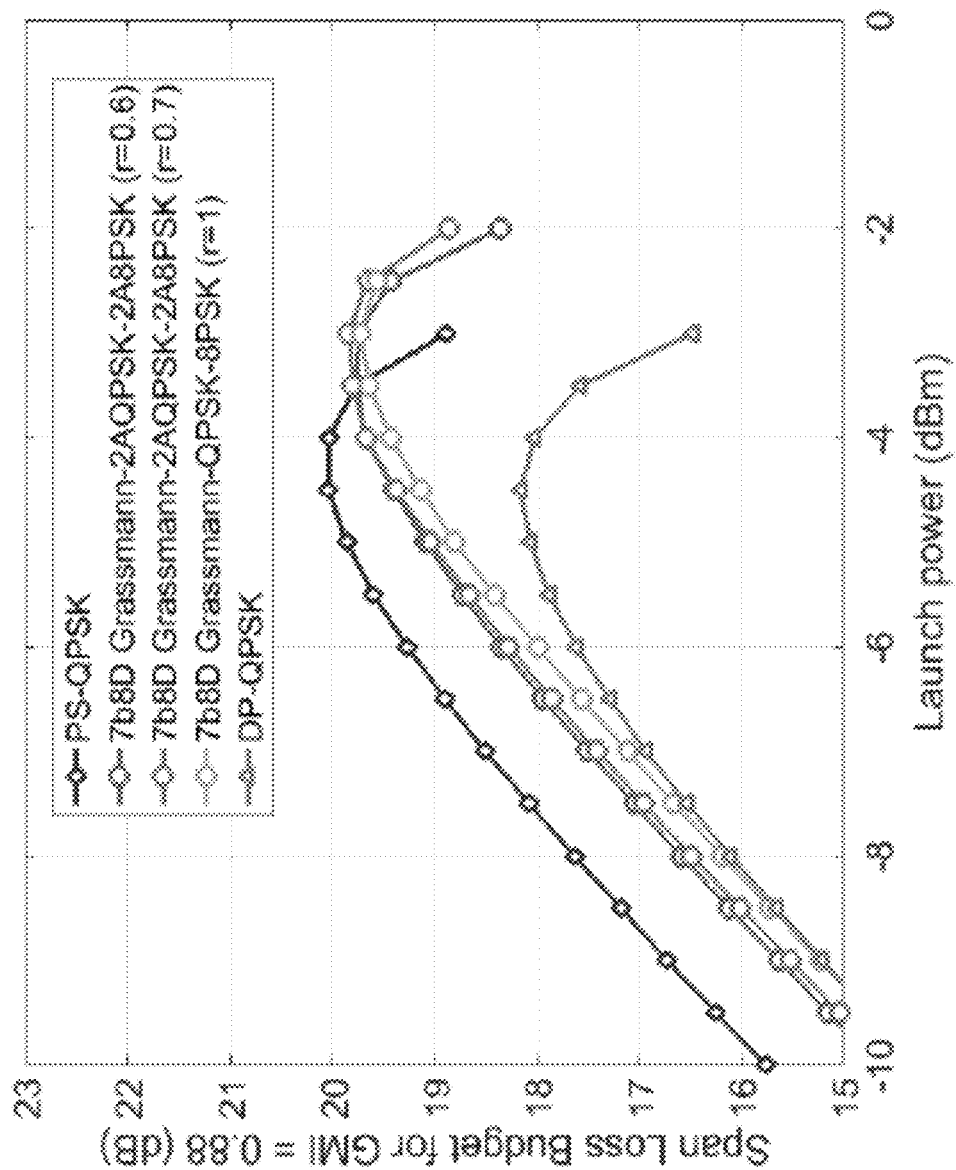
FIG. 12A is an example of the span loss budget of 7b8D modulation.

In this case, a value of B[7] designates the circular ring, $r_1$ or $r_2$, for information bits assigned to the x1 and y1 in the time slot 1, and a value of B[8] designates the circular ring, $r_1$ or $r_2$, for information bits assigned to the x2 and y2 in the time slot 2. FIG. 12A is an example of the span loss budget of 7b8D modulation format (3.5 bits/symbol) as well as PS-QPSK (3 bits/symbol) and DP-QPSK (4 bits/symbol) modulation formats. This clearly shows that 7b8D Grassmann-2AQPSK-2A8PSK with the ring ratio of about 0.7 gives the best transmission characteristics at 3.5 bits/symbol, and even comparable to that of 3 bits/symbol.

Alternatively, the following relations may be used for the parity arrangements.

$$B[7] = XOR(B[4], B[5], B[6]) \quad (11)$$

$$B[8] = XOR(B[0], B[1], B[2], B[3], B[4], B[5], B[6]) \quad (12)$$

6-bit 8 Dimension Grassmann 2AQPSK Format

For instance, a 3 bits/symbol format may be achieved as follows.

FIG. 11A is an example of a 7-bit 8 dimension n 2AQPSK format used for the 3 bits/symbol format. Two time slots, a time slot 1 and a time slot 2, are used for a 3-bit symbol in the format. 2AQPSK is considered to be a special case of 2A8PSK. As the 6-bit symbol is divided by two slots, this format is called the 3 bits/symbol format. The time slot 1 arranges x1 in the X-polarization constellation and y1 in the Y-polarization constellation, and the time slot 2 arranges x2 in the X-polarization constellation and y2 in the Y-polarization constellation. In this case, x1, x2, y1 and y2 are all arranged to the 2AQPSK format as indicated in the figure.

Figure 11B:
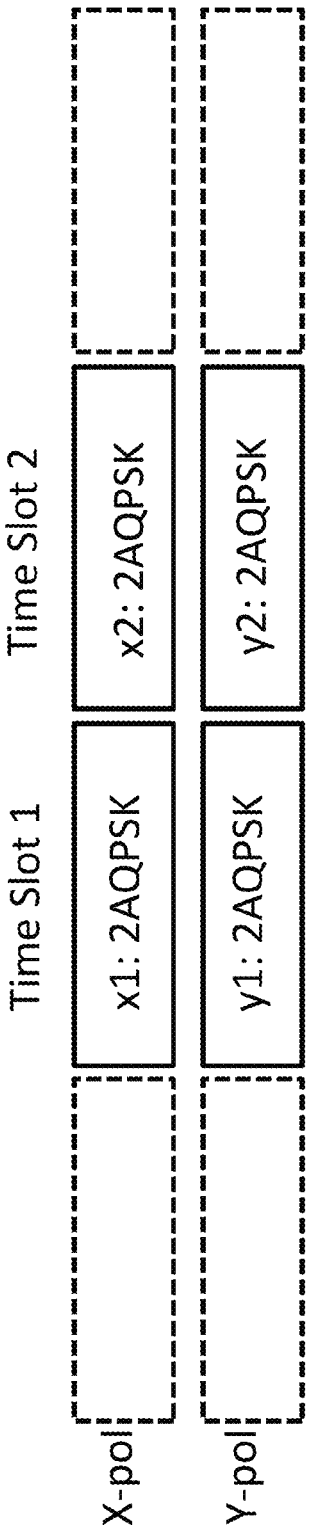
FIG. 11B shows is an example of a 6-bit 8 dimension Grassmann 2AQPSK format.

Further, FIG. 11B is an example of a 6-bit 8 dimension Grassmann 2AQPSK format. Two time slots, a time slot 1 and a time slot 2, are used for a 6-bit symbol in the format. As the 6-bit symbol is divided by two slots, this format is called the 3 bits/symbol format. The time slot 1 arranges x1 in the X-polarization constellation and y1 in the Y-polarization constellation, and the time slot 2 arranges x2 in the X-polarization constellation and y2 in the Y-polarization constellation. In this case, x1 and y1 are arranged to the 2AQPSK format, x2 and y2 are arranged also to the 2AQPSK format as indicated in the figure.

When x1, x2 and y1 are arranged to be independent variable, the Grassmann code requires x1, x2, y1 and y2 to satisfy the following relation.

$$y2 = -x1^* \cdot y1/x2^* \quad (13)$$

where * denotes complex conjugate.

Further, the 2AQPSK format is designed to use the identical circular rings $r_1$ and $r_2$ (see FIGS. 2A and 2B), when x1 takes the circular ring $r_1$, y1 takes the circular ring $r_2$, or vice versa. Similarly, when x2 takes the circular ring $r_1$, y2 takes the circular ring $r_2$, or vice versa.

In order to require an average power per a polarization constellation being 1, there is a relation between the circular rings $r_1$ and $r_2$, since the amplitude rings indicate amplitude values.

$$r_1^2 + r_2^2 = 2 \quad (14)$$

The ratio of the amplitude rings $r_1/r_2$ may be between 0.5 and 0.8.

When B[0]~B[5] are used as information bits (modulation bits), the parity bits B[6]~B[7] may be used as parity bits as follows.

$$B[6] = XOR(B[4], B[5]) \quad (15)$$

$$B[7] = XOR(B[0], B[1], B[2], B[3]) \quad (16)$$

In this case, a value of B[6] designates the circular ring, $r_1$ or $r_2$, for information bits assigned to the x1 and y1 in the time slot 1, and a value of B[7] designates the circular ring, $r_1$ or $r_2$, for information bits assigned to the x2 and y2 in the time slot 2.

Non-Constant Modulus Based 4D-2A8PSK Modulation Format

In some embodiments, another modulation scheme requires a condition that an average power per a polarization constellation is not 1. In such a case, a first average power used in the time slot 1 and a second average power used in the time slot 2 is arranged to be different. For instance, when the first average power is arranged to be greater than a predetermined average power, then the second average power is arranged to be smaller than the predetermined average power. Similarly, when the first average power is arranged to be smaller than a predetermined average power, then the second average power is arranged to be greater than the predetermined average power.

In other words, when information bits of a symbol are arranged in a first X-polarization constellation and a first Y-polarization constellation in the time slot 1 and arranged in a second X-polarization constellation and a second Y-polarization constellation in the time slot 2.

In similar manner to FIG. 2A and FIG. 2B, the first X-polarization constellation includes a first circular ring Rx1 with a first radius $r_{x1}$ and a second circular ring Rx2 with a second radius $r_{x2}$, the second X-polarization constellation includes a first circular ring Rxx1 with a first radius $r_{xx1}$ and a second circular ring Rxx2 with a second radius $r_{xx2}$, the first Y-polarization constellation includes a first circular ring Ry1 with a first radius $r_{y1}$ and a second circular ring Ry2 with a second radius $r_{y2}$, and the second Y-polarization constellation includes a first circular ring Ryy1 with a first radius $r_{yy1}$ and a second circular ring Ryy2 with a second radius $r_{yy2}$.

In this case, the following relation is established.

$$r_{x1}^2 + r_{y1}^2 + r_{x2}^2 + r_{y2}^2 = r_{xx1}^2 + r_{yy1}^2 + r_{xx2}^2 + r_{yy2}^2 \quad (16)$$

Namely, as long as the relation (16) is satisfied under the 4D-2A8PSK modulation format scheme according to an embodiment of the invention, any combinations are available regarding the first X-polarization constellation and the first Y-polarization constellation in the time slot 1 and the second X-polarization constellation and the second Y-polarization constellation in the time slot 2.

Figure 12B:
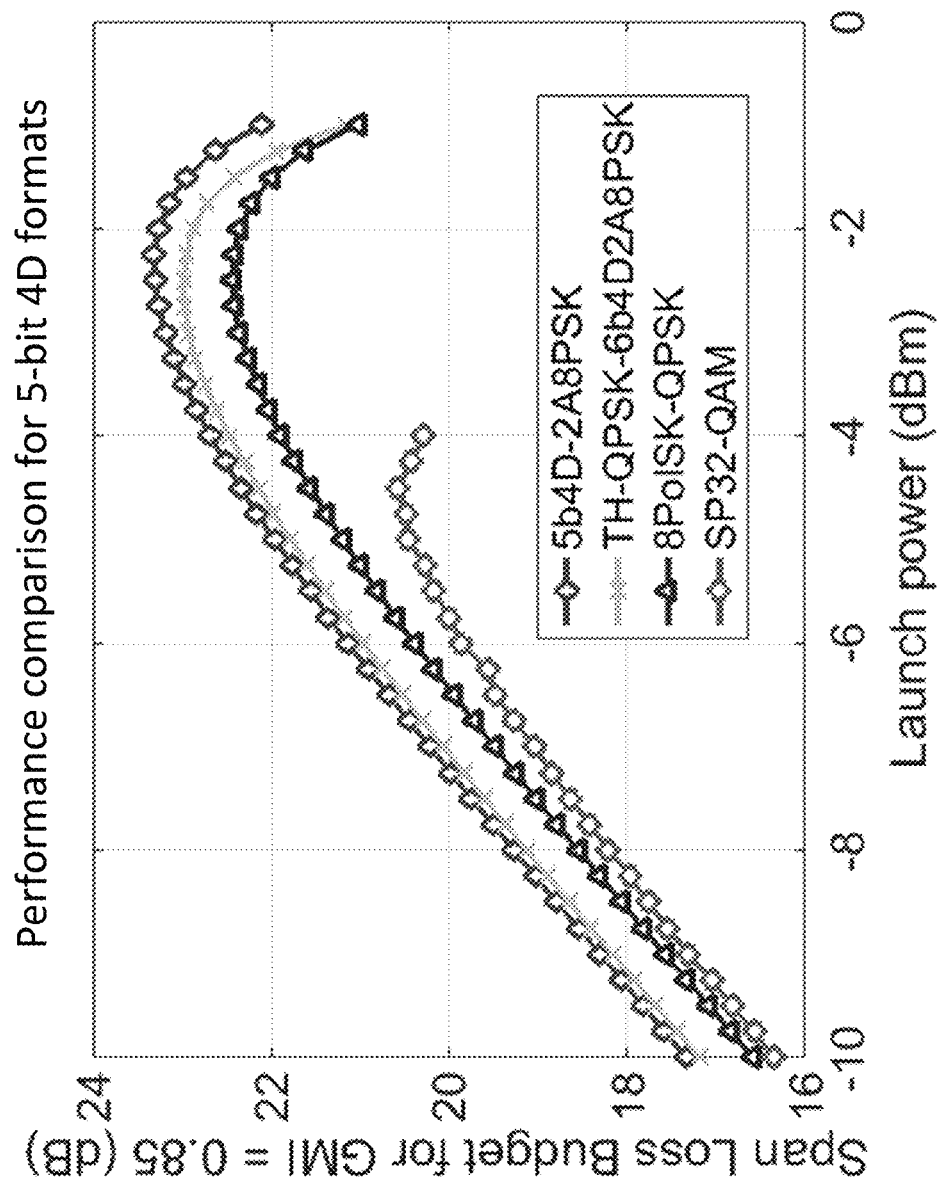
FIG. 12B is three types of 5 bits/symbol formats.

FIG. 12B is three types of 5 bits/symbol formats for comparison. In this case, r2/r1=0.6 is used for 5b4D-2A8PSK for maximizing the span loss budget. Span loss budget at a target generalized mutual information (GMI) of 0.85 is used as a metric, and the launch power is varied. The higher the peak span loss budget, the longer distance the signal can be transmitted. Span loss budget for SP32-QAM saturates quickly due to large power variations, since it is based on 8QAM (set partition of 16QAM). On the other hand, 8PolSK-QPSK13 has 0.4 dB worse OSNR for the linear case, the saturation characteristics is very similar to 5b4D-2A8PSK, due to its 4D constant modulus property. Overall, 5b4D-2A8PSK has the increased maximum span lossbudgetby0.3 dB over 8PolSK-QPSK, and by 2 dB over SP32-QAM.

Figure 13:
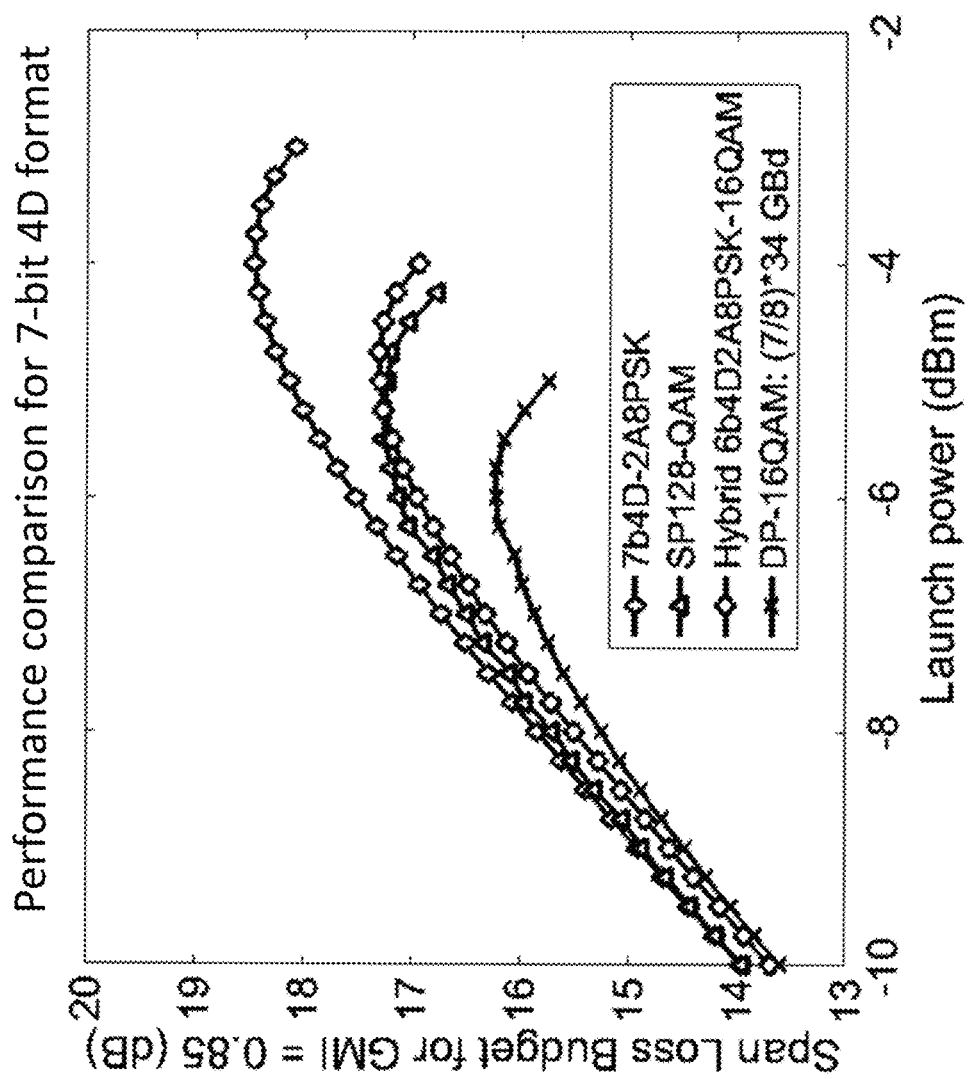
FIG. 13 shows three types of 7 bits/symbol formats and DP-16QAM.

FIG. 13 shows three types of 7 bits/symbol formats and DP-16QAM of the same data rate ((7/8)*34GBd) for comparison. In this case, r2/r1=0.59 is chosen for 7b4D-2A8PSK the maximum span loss budget. DP-16QAM suffer from fiber nonlinearity, since it has strong power variations. SP128-QAM suffers also from fiber nonlinearity, since it is based on 16QAM. Time-domain hybrid 6b4D-2A8PSK-16QAM uses the best modulation formats at 6 and 8 bits/symbol to achieve 7 bits/symbol. By using constant modulus format at least in one time slot, the nonlinear transmission performance is improved significantly compared to the pure 16QAM case.

The format schemes described above allow to cover a wide range of bits/symbol formats, offering great advantages in industrial use because the conventionally used signal processing building blocks can be used over a wide spectral efficiency range.

Figure 14:
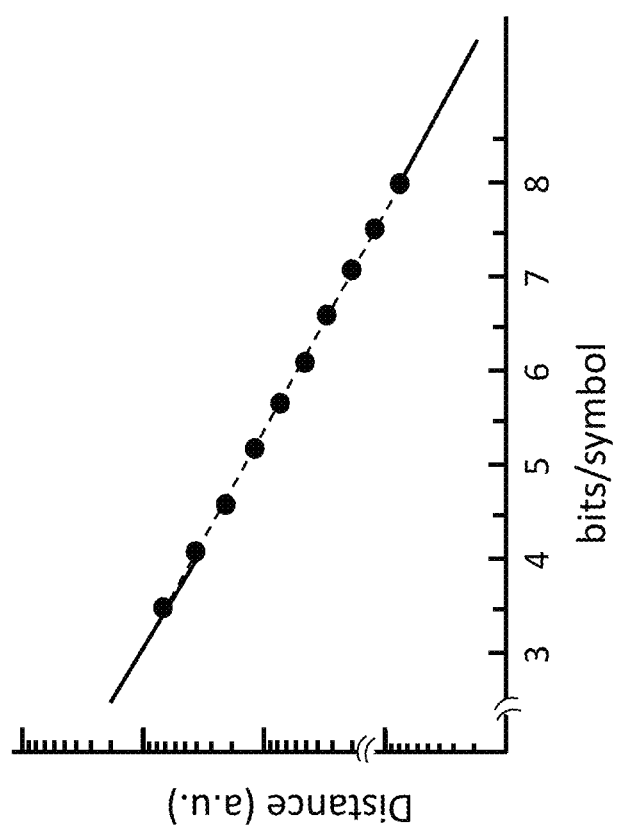
FIG. 14 shows a relation between communication distances and number of bits for different symbol/bits.

FIG. 14 shows a relation between communication distances and number of bits in different symbol/bits. In conventional formats, there are a missing range between 4 bits/symbol and 8 bits/symbol. On the other hand, the 4D-2A8PSK Modulation Format Scheme according to the invention can cover a range between 3.25 and 8 bits/symbol formats by introducing the Time-domain hybrid scheme as indicated by dark spots in the figure.

In some embodiments of the invention, a non-transient computer-readable recording medium may store a program to be executed by a processor for encoding a symbol to optical signal data. The program causes the processor to execute steps of selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles; arranging a first part of a symbol on a first circular grid of the first amplitude ring on the X-polarization constellation format; arranging a second part of the symbol on a second circular grid of the second amplitude ring on the Y-polarization constellation format; encoding the first part of the symbol into a first subset of an optical data code using the first amplitude ring indicating a first amplitude value and the first circular grid indicating a first phase angle; and encoding the second part of the symbol into a second subset of the optical data code using the second amplitude ring indicating a second amplitude value and the second circular grid indicating a second phase angle.

Further, the first subset of the symbol may be represented by first four bits having three bits indicating the first phase angle in Gray coding and one bit being a first parity indicating the first amplitude value of the first subset of the symbol, and the second subset of the symbol is represented by second four bits having three bits indicating the second phase angle in Gray coding and one bit being a second parity indicating the second amplitude value of the second subset of the symbol.

In some embodiments, the first subset of the symbol and the second subset of the symbol are arranged into at least two signal intervals. Further, in another embodiment, the first subset of the symbol and the second subset of the symbol are arranged in a single signal interval. In accordance with some embodiments of the invention, the symbol is assigned predetermined five information bits of b0, b1, b2, b3 and b4, wherein the three bits of the first four bits are represented by the information bits b0, b1 and b2, and the three bits of the second four bits are represented by information bits b3, b4 and a third parity bit b5, wherein the third parity bit b5 is determined by a logical exclusive-OR (XOR) operation expressed by b5=XOR(b0, b1, b2), wherein the first parity bit and the second parity bit are respectively represented by additional bits b6 and b7, wherein the first parity bit is determined by the XOR operation expressed by b6=XOR(b0, b1, b3, b4), and wherein the second parity bit is determined by a logical NOT operation expressed by b7=NOT(b6).

In another embodiment, the symbol is assigned predetermined six information bits of b0, b1, b2, b3, b4 and b5, wherein the three bits of the first four bits are represented by the information bits b0, b1 and b2, and the three bits of the second four bits are represented by the information bits b3, b4 and b5, wherein the first parity bit and the second parity bit are respectively represented by additional bits b6 and b7, wherein the first parity bit is determined by a logical exclusive-OR (XOR) operation expressed by b6=XOR(b0, b1, b2, b3, b4, b5), and wherein the second parity bit is determined by a logical NOT operation expressed by b7=NOT(b6).

Further, in accordance with some embodiments, the symbol is represented by seven information bits b0, b1, b2, b3, b4, b5 and b6, wherein the three bits of the first four bits are represented by the information bits b0, b1 and b2, and the first parity bit is represented by the information bit b3, wherein the three bits of the second four bits are represented by the information bits b4, b5 and b6, and the second parity bit is represented by an additional bit b7 determined by a logical NOT operation expressed by b7=NOT(b3).

In accordance with another embodiment, the first amplitude value is different from the second amplitude value.

According to another embodiment, the symbol is represented by seven information bits b0, b1, b2, b3, b4, b5 and b6, wherein the first four bits are represented by the information bits b0, b1, b2, and b3, and the three bits of the second four bits are represented by the information bits b3, b4 and b5, wherein the additional parity bit b7 is determined by a logical NOT operation expressed by b7=NOT(b3). Further, in another embodiment, the first amplitude value is different from the second amplitude value.

Although several preferred embodiments have been shown and described, it would be apparent to those skilled in the art that many changes and modifications may be made thereunto without the departing from the scope of the invention, which is defined by the following claims and their equivalents.

We claim:

1. An optical data coding method for generating optical data codes from a symbol using a processor in communication with a memory, the method comprising steps of;
    selecting a modulation scheme comprising an X-polarization constellation format having first and second amplitude rings with circular grids corresponding to predetermined phase angles and a Y-polarization constellation format having the first and second amplitude rings with the circular grids corresponding to the predetermined phase angles;
    arranging a first part of the symbol on a first circular grid of the first amplitude ring on the X-polarization constellation format;
    arranging a second part of the symbol on a second circular grid of the second amplitude ring on the Y-polarization constellation format;
    encoding the first part of the symbol into a first subset of an optical data code using the first amplitude ring indicating a first amplitude value and the first circular grid indicating a first phase angle; and
    encoding the second part of the symbol into a second subset of the optical data code using the second amplitude ring indicating a second amplitude value and the second circular grid indicating a second phase angle.

2. The method of claim 1, wherein the first subset of the optical data code is represented by first four bits having three bits indicating the first phase angle in Gray coding and one bit being a first parity bit indicating the first amplitude value, and the second subset of the optical data code is represented by second four bits having three bits indicating the second phase angle in Gray coding and one bit being a second parity bit indicating the second amplitude value of the second subset of the symbol.

3. The method of claim 2, wherein the symbol is assigned predetermined five information bits of b0, b1, b2, b3 and b4,
    wherein the three bits of the first four bits are represented by the information bits b0, b1 and b2, and the three bits of the second four bits are represented by information bits b3, b4 and a third parity bit b5, and the first parity bit and the second parity bit are respectively represented by additional bits b6 and b7,
    wherein the third parity bit b5 is determined by a logical exclusive-OR (XOR) operation of a first predetermined combination of b0, b1, b2, b3 and b4,
    wherein the first parity bit is determined by the XOR operation expressed by the logical XOR operation of a second predetermined combination of b0, b1, b2, b3 and b4, and
    wherein the second parity bit is determined by a logical NOT operation expressed by b7=NOT(b6).

4. The method of claim 2, wherein the symbol is assigned predetermined five information bits of b0, b1, b2, b3 and b4,
    wherein the three bits of the first four bits are represented by the information bits b0, b1 and b2, and the three bits of the second four bits are represented by information bits b3, b4 and a third parity bit b5, and the first and second parity bits are respectively represented by additional bits b6 and b7,
    wherein the third parity bit b5 is determined by a logical exclusive-OR (XOR) operation expressed by b5=XOR (b0, b1, b2),
    wherein the first parity bit is determined by the XOR operation expressed by b6=XOR(b2, b3, b4), and
    wherein the second parity bit is determined by a logical NOT operation expressed by b7=NOT(b6).

5. The method of claim 2, wherein the symbol is assigned predetermined five information bits of b0, b1, b2, b3 and b4,
    wherein the three bits of the first four bits are represented by the information bits b0, b1 and b2, and the three bits of the second four bits are represented by information bits b3, b4 and a third bit b5, and the first parity bit and the second parity bit are respectively represented by additional bits b6 and b7,
    wherein the third parity bit b5 is determined by a logical exclusive-OR (XOR) operation expressed by b5=XOR (b0, b1, b2),
    wherein the first parity bit is determined by the XOR operation expressed by b6=XOR(b0, b1, b3, b4), and
    wherein the second parity bit is determined by a logical NOT operation expressed by b7=NOT(b6).

6. The method of claim 2, wherein the symbol is assigned predetermined six information bits of b0, b1, b2, b3, b4 and b5,
    wherein the three bits of the first four bits are represented by the information bits b0, b1 and b2, the three bits of the second four bits are represented by the information bits b3, b4 and b5, and the first parity bit and the second parity bit are respectively represented by additional bits b6 and b7,
    wherein the first parity bit is determined by a logical exclusive-OR (XOR) operation of a predetermined combination of b0, b1, b2, b3, b4, and b5, and
    wherein the second parity bit is determined by a logical NOT operation expressed by b7=NOT(b6).

7. The method of claim 2, wherein the symbol is assigned predetermined six information bits of b0, b1, b2, b3, b4 and b5,
    wherein the three bits of the first four bits are represented by the information bits b0, b1 and b2, the three bits of the second four bits are represented by the information bits b3, b4 and b5, and the first parity bit and the second parity bit are respectively represented by additional bits b6 and b7,
    wherein the first parity bit is determined by a logical exclusive-OR (XOR) operation expressed by b6=XOR (b0, b1, b2, b3, b4, b5), and
    wherein the second parity bit is determined by a logical NOT operation expressed by b7=NOT(b6).

8. The method of claim 2, wherein the symbol is represented by seven information bits b0, b1, b2, b3, b4, b5 and b6,
    wherein the three bits of the first four bits are represented by the information bits b0, b1 and b2, and the first parity bit is represented by the information bit b3,
    wherein the three bits of the second four bits are represented by the information bits b4, b5 and b6, and the second parity bit is represented by an additional bit b7 determined by a logical NOT operation expressed by b7=NOT(b3).

9. The method of claim 2, wherein the first subset of the optical data code and the second subset of the optical data code are arranged into at least two time slots.

10. The method of claim 2, wherein at least one of the first and second subsets is arranged into one time slot among a plurality of time slots.

11. The method of claim 1, wherein a seven-bit (7-bit) symbol occupies two time slots,
wherein one of the two time slots uses a two-amplitude quadrature phase-shift keying (2AQPSK) format arranging a variable x1 in an X-polarization constellation and a variable y1 in a Y-polarization constellation, and another time slot uses a two-amplitude eight phase-shift keying (2A8PSK) format arranging a variable x2 in the X-polarization constellation and a variable y2 in the Y-polarization constellation,
wherein both 2AQPSK and 2A8PSK formats are four-dimensional (4D) constant modulus,
and wherein Grassmann code condition satisfies $y2 = -x1^* \cdot y1/x2^*$.

12. The method of claim 1, wherein a six-bit (6-bit) symbol occupies two time slots,
wherein one of the two time slots uses a two-amplitude quadrature phase-shift keying (2AQPSK) format arranging a variable x1 in an X-polarization constellation and a variable y1 in a Y-polarization constellation, and another time slot uses the 2AQPSK format arranging a variable x2 in the X-polarization constellation and a variable y2 in the Y-polarization constellation,
wherein both 2AQPSK formats are four dimensional (4D) constant,
and wherein Grassmann code condition satisfies $y2 = -x1^* \cdot y1/x2^*$.

13. The method of claim 1, further comprising:
providing a second symbol including first and second parts, wherein the first and second parts of the second symbol are respectively arranged to a second X-polarization constellation format and a second Y-polarization constellation format; and
encoding the first and second parts of the second symbol into first and second subsets of a second optical data code,
wherein the optical data code of the symbol and the second optical data code of the second symbol are arranged to at least two time slots, and wherein one of the time slots is occupied by the subsets of the optical data code and another one of the time slots is occupied by the subsets of the second optical data code.

14. The method of claim 1, wherein an adaptive equalizer uses the constant modulus algorithm which forces the sum of the powers in X- and Y-polarization at a symbol time to be constant.

15. The method of claim 1, wherein an adaptive equalizer uses radial-directed equalizer, in which the polarization whose relative power at the symbol time is higher chooses the large radius than the other.

16. The method of claim 1, wherein an adaptive equalizer uses radial-directed equalizer, in which the polarization whose relative power at the symbol time is higher has the higher probability to choose the large radius than the other.

17. An optical transmitter comprising:
an encoder device configured to generate and transmit first and second modulation signals, wherein the encoder device generates the first and second modulation signals based on optical data codes generated by using an optical data coding method of claim 1;
a continuous wave (CW) optical source configured to transmit a CW optical signal;
a polarization beam splitter configured to split the CW optical signal of the CW optical source into first and second parts of the CW optical signal;
a first modulator connected to the encoder device, wherein the first modulator receives and modulates the first part of the CW optical signal to generate a first modulated optical carrier signal according to the first modulation signal;
a second modulator connected to the encoder device, wherein the second modulator receives and modulates the second part of the CW optical signal to generate a second modulated optical carrier signal according to the second modulation signal; and
a beam combiner configured to combine the first and second modulated optical carrier signals to generate and transmit a modulated optical carrier signal.

18. The optical transmitter of claim 17, further comprising:
an I/O part connected to the encoder device, wherein the I/O part receives and transmits a replacement encoding program the encoder device such that the encoder device modulates the first and second modulation signals according to the replacement encoding program.

* * * * *